United States Patent
Nasuno et al.

(10) Patent No.: US 9,520,722 B2
(45) Date of Patent: Dec. 13, 2016

(54) SOLAR POWER GENERATION MANAGEMENT APPARATUS

(71) Applicants: EPSEL Co., Ltd., Kawaguchi-shi, Saitama (JP); EPSEM Co., Ltd., Kawaguchi-shi, Saitama (JP)

(72) Inventors: Masumi Nasuno, Saitama (JP); Hideichi Azuma, Saitama (JP); Manabu Fujii, Saitama (JP)

(73) Assignees: EPSEL CO., LTD., Kawaguchi-shi, Saitama (JP); EPSEM CO., LTD., Kawaguchi-shi, Saitama (JP)

( * ) Notice: Subject to any disclaimer, the term of this patent is extended or adjusted under 35 U.S.C. 154(b) by 0 days.

(21) Appl. No.: 15/036,682

(22) PCT Filed: Nov. 14, 2014

(86) PCT No.: PCT/JP2014/080142
§ 371 (c)(1),
(2) Date: Jul. 7, 2016

(87) PCT Pub. No.: WO2015/072531
PCT Pub. Date: May 21, 2015

(65) Prior Publication Data
US 2016/0308363 A1    Oct. 20, 2016

(30) Foreign Application Priority Data
Nov. 15, 2013  (JP) .................. 2013-236976

(51) Int. Cl.
*H02S 50/00* (2014.01)
*H02S 50/10* (2014.01)
(Continued)

(52) U.S. Cl.
CPC ............. *H02J 3/383* (2013.01); *G01R 21/133* (2013.01); *H02J 3/14* (2013.01); *H02S 50/00* (2013.01)

(58) Field of Classification Search
CPC ....... G06F 19/00; G01R 31/26; G01R 21/133; H02S 50/00; H02S 50/10
(Continued)

(56) References Cited

U.S. PATENT DOCUMENTS 5,869,956 A * 2/1999 Nagao ...................... G05F 1/67
                                                        323/299
9,118,215 B2   8/2015 Fishman et al.
(Continued)

FOREIGN PATENT DOCUMENTS

JP    2010-288393 A    12/2010
JP    2012-84027 A      4/2012
(Continued)

OTHER PUBLICATIONS

Form PCT/ISA/210 issued in PCT/JP2014/080142 with English translation dated Feb. 24, 2015 (6 pages).
(Continued)

*Primary Examiner* — Rexford Barnie
*Assistant Examiner* — Terrence Willoughby
(74) *Attorney, Agent, or Firm* — Flynn, Thiel, Boutell & Tanis, P.C.

(57) ABSTRACT

A solar power generation management apparatus which manages a solar power generation system includes: an output sensor that senses respective output current values or output voltage values of a plurality of unit power generation modules; and a calculator that receives sensing information from the output sensor and displays it on a display (50). The calculator acquires the sensing information of the output sensor and simultaneously displays a plurality of display frames (212) corresponding to the plurality of unit power generation modules on the display. Furthermore, it sets a color level of information displayed in the display frame (212) correspondingly to a level of the sensing information.

(Continued)

As a result, operating situations of the plurality of unit power generation modules can be visually monitored based on the color levels in the display frames on the display, which enables maintenance timing of solar panels to be visually recognized.

20 Claims, 6 Drawing Sheets

(51) Int. Cl.
*H02J 3/38* (2006.01)
*G01R 31/40* (2014.01)
*H02J 3/14* (2006.01)
*G01R 21/133* (2006.01)

(58) Field of Classification Search
USPC .............................. 702/58, 59; 307/42, 82, 84
See application file for complete search history.

(56) References Cited

U.S. PATENT DOCUMENTS

| | | |
|---|---|---|
| 2010/0313931 A1 | 12/2010 | Yoneda et al. |
| 2012/0080955 A1 | 4/2012 | Fishman et al. |
| 2012/0084027 A1* | 4/2012 | Caine ...................... H02S 50/10 702/58 |
| 2013/0138259 A1 | 5/2013 | Yokoyama |
| 2015/0054830 A1 | 2/2015 | Inuzuka et al. |

FOREIGN PATENT DOCUMENTS

| | | |
|---|---|---|
| JP | 2012-124188 A | 6/2012 |
| JP | 2013-113739 A | 6/2013 |
| JP | 2013-219211 A | 10/2013 |
| JP | 2013-541930 A | 11/2013 |
| JP | 2014-75878 A | 4/2014 |
| JP | 2014-89998 A | 5/2014 |
| WO | WO 2013/124973 A1 | 8/2013 |

OTHER PUBLICATIONS

Form PCT/ISA/220 issued in PCT/JP2014/080142 dated Feb. 24, 2015 (2 pages).
Form PCT/ISA/237 issued in PCT/JP2014/080142 dated Feb. 24, 2015 (5 pages).
"String Monitoring System for Mega Solar", SEI Technical Review, No. 183, Sumitomo Electric Industries, Ltd., Jul. 2013, pp. 162 to 163; with English translation (8 pages).

* cited by examiner

SOLAR POWER GENERATION MANAGEMENT APPARATUS

TECHNICAL FIELD

The present invention relates to a solar power generation management apparatus which manages a solar power generation system using a plurality of solar panels, and, for example, relates to an apparatus suitable for a so-called mega solar power plant using a large number of solar panels.

BACKGROUND ART

Conventionally, in view of environmental conservation, solar power generation systems using a plurality of solar panels have been utilized for residential use and industrial use. For example, in the case of residential use, a solar power generation system is installed on a roof, generated power is used for daily life and surplus power is sold to an electric power company.

In recent years, in order to further reduce environmental loads in supplying electric power, a mega solar power plant in which hundreds to thousands of solar panels are arranged on a large plot of land is attracting attention. The mega solar power plant is a large-scale solar power generation system, for example, achieving output over one megawatt and is expected to be a key power source for renewable energy. Japan has a Feed-in Tariff Program for renewable energy, and accordingly, can have electric power companies buy the electric power generated in the mega solar power plant at a certain rate. Since the mega solar power plant can also effectively utilize idle land, local autonomies also are developing the business in association with private companies.

SUMMARY OF INVENTION

Technical Problem

In the mega solar power plant, the output of the large number of solar panels is managed as a whole. For example, in the case of a mega solar power plant using 1000 solar panels, even if the output of one solar panel falls down to 50% of rated value, an output decrease over the mega solar power plant is still approximately 0.05% as a whole, which does not matter at all. The reason is that the manufacturer of solar panels guarantees an output decrease of less than 10% over 10 years and allows quality deterioration of less than 1% per year. In other words, in the case of the mega solar power plant using 1000 solar panels, it can be considered that an output stop corresponding to 10 solar panels per year would be in the range of the quality guarantee.

Meanwhile, the administrator of the mega solar power plant who wants to enhance a recovery efficiency of invested costs wants a power generation amount to be maintained high at all times by carefully performing maintenance of the solar panels even within an allowable range of the manufacturer guarantee. In a conventional mega solar power plant, however, it cannot be easily determined on which solar panel an abnormality arises. On the other hand, to check over the hundreds to thousands of solar panels at the site is not realistic because of its huge operation load.

The present invention is devised in view of the aforementioned problems and an object thereof is to provide a solar power generation management apparatus for facilitating maintenance of solar panels in a solar power generation system.

Solution to Problem

In order to achieve the aforementioned object of the present invention, there is provided a solar power generation management apparatus which manages a solar power generation system using a plurality of solar panels, including: an output sensor that senses respective output current values or output voltage values of a plurality of unit power generation modules, taking any of a single solar panel and a panel group composed of a predetermined number of solar panels as a unit power generation module; and a calculator that is connected to the output sensor and receives sensing information from the output sensor to display an operating situation of the solar power generation system on a display, wherein the calculator has sensing information acquisition means that acquires the sensing information of the output sensor, display management means that simultaneously displays a plurality of display frames corresponding to the plurality of unit power generation modules on the display, and display color setting means that sets a color level of information displayed in the display frame correspondingly to a level of the sensing information acquired by the sensing information acquisition means, and enables operating situations of the plurality of unit power generation modules to be visually monitored based on the color levels in the plurality of display frames on the display.

Related to the aforementioned solar power generation management apparatus, the calculator includes abnormality condition setting means that sets an abnormality condition for sensing abnormality of the unit power generation module, and abnormality determination means that determines whether or not the sensing information satisfies the abnormality condition, and when the abnormality condition is satisfied, displays abnormality information in the display frame.

Related to the aforementioned solar power generation management apparatus, the abnormality condition setting means of the calculator is capable of setting different conditions for the individual unit power generation modules.

Related to the aforementioned solar power generation management apparatus, the abnormality condition setting means of the calculator uses the sensing information of the unit power generation module adjacent to a specific unit power generation module as the abnormality condition of the specific unit power generation module.

Related to the aforementioned solar power generation management apparatus, the abnormality condition setting means of the calculator uses past sensing information of a specific unit power generation module as the abnormality condition of the specific unit power generation module.

Related to the aforementioned solar power generation management apparatus, a connection box that collects output lines of the plurality of unit power generation modules is included, wherein the output sensor that senses the output current values or the output voltage values of the output lines is integrally contained in the connection box.

Related to the aforementioned solar power generation management apparatus, a switching device that switches output lines of the unit power generation modules so as to connect them to any of a power selling-side line and a power storage-side line is included, wherein the calculator further has switching control means that controls the switching device using the sensing information.

Related to the aforementioned solar power generation management apparatus, the switching control means of the calculator refers to a power selling upper limit value of the power selling-side line and controls the switching device such that a total output of the plurality of unit power generation modules is approximated to the power selling upper limit value.

Related to the aforementioned solar power generation management apparatus, the display management means in the calculator displays the plurality of display frames on the display in a state where they coincide with an arrangement layout of the unit power generation modules at a site.

Related to the aforementioned solar power generation management apparatus, a wireless communication terminal that connects the output sensor and the calculator through wireless communication is included.

Advantageous Effects of Invention

According to the present invention, there can be achieved excellent effects that operating situations of solar panels in the solar power generation system can be properly noticed and maintenance can be systematically performed.

DESCRIPTION OF EMBODIMENTS

Hereinafter, embodiments of the present invention are described with reference to the appended drawings.

Figure 1:
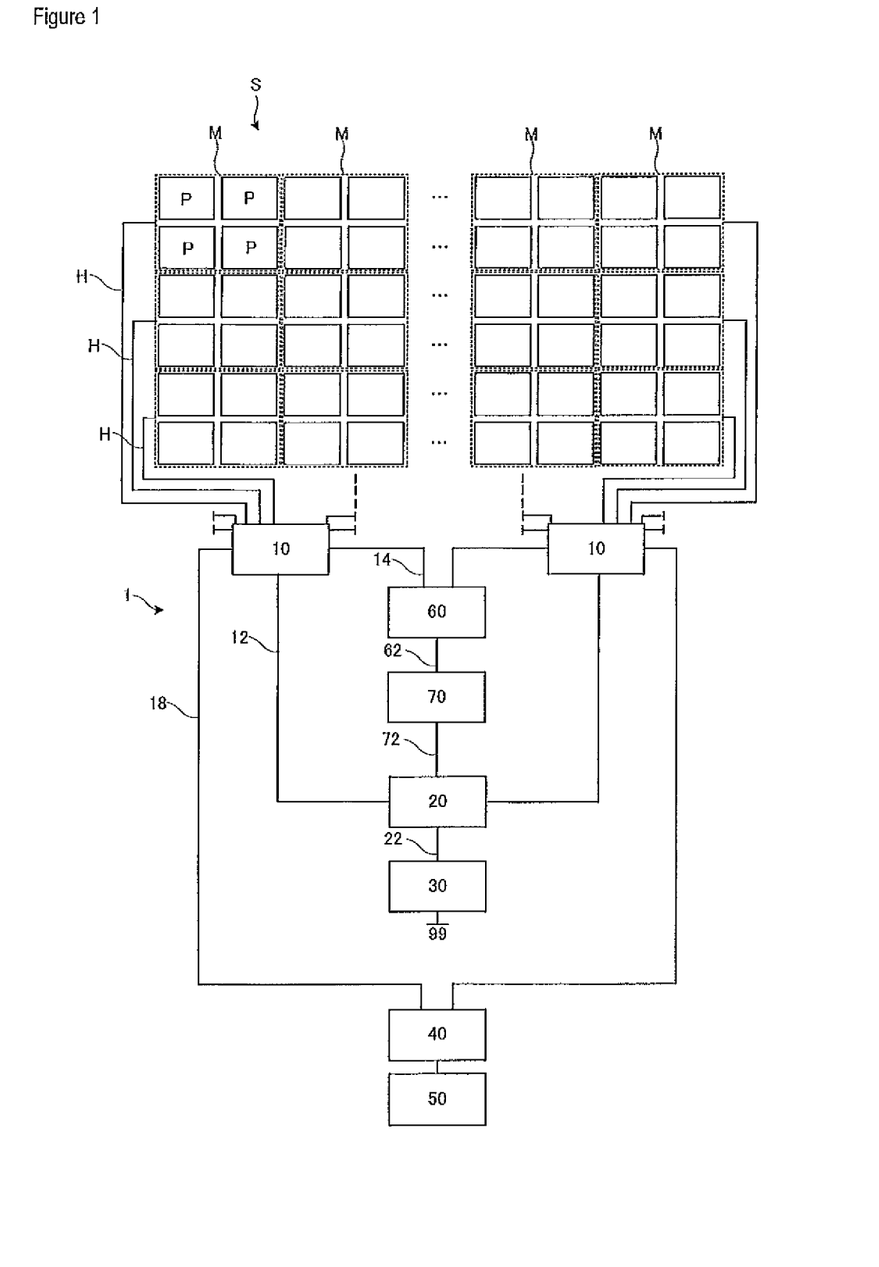
FIG. 1 is a diagram illustrating a solar power generation management apparatus according to an embodiment of the present invention.

FIG. 1 illustrates an overall configuration of a solar power generation management apparatus 1 according to an embodiment of the present invention. Notably, the solar power generation management apparatus 1 manages an operating situation of a solar power generation system S using a plurality of solar panels P.

The solar power generation system S by way of example includes 1000 solar panels P. The solar panels P take a structure in which four of those are managed as one set of panel group which is a unit power generation module M. Namely, four solar panels P are connected to one another in series, and they as a unit power generation module collectively output electric power. Accordingly, the solar power generation system S totally includes 250 unit power generation modules M. Notably, while here is exemplarily presented the case where four solar panels P are set into a module, for example, approximately 10 to 20 solar panels P may be the unit power generation module M or one solar panel P may be the unit power generation module M.

The solar power generation management apparatus 1 includes: a connection box 10 to which output lines H of the unit power generation modules M are connected; a power selling-side collection box 20 to which a power selling-side output line 12 collected into one in the connection box 10 is connected; a power storage-side collection box 60 to which a power storage-side output line 14 collected into one in the connection box 10 is connected; a battery 70 to which an output line 62 integrated in the power storage-side collection box is connected; a power conditioner 30 to which an output line 22 collected in the power selling-side collection box 20 and an output line 72 of the battery 70 are connected; a calculator 40 connected to an output sensor (mentioned later) and a switching device (mentioned later) in the connection box 10 via a wired or wireless communication line 18; and a display 50 connected to the calculator. Notably, not specially illustrated here, an output current value to the output line 72 side from the battery 70 is controlled at any time by a not specially shown control device.

To each connection box 10, the output lines H of the 10 unit power generation modules M are connected. Accordingly, 25 connection boxes 10 are prepared. To each power selling-side collection box 20, the power selling-side output lines 12 of the five connection boxes 10 are connected. Also to each power storage-side collection box 60, the power storage-side output lines 14 of the five connection boxes 10 are connected. The batteries 70 are provided correspondingly to the individual power storage-side collection boxes 60. The power conditioners 70 are also disposed correspondingly to the individual power selling-side collection boxes 20. The calculator 40 is connected to all of the connection boxes 10. Thus, outputs of the 1000 solar panels P are collected into five systems via the 250 unit power generation modules M, the 25 connection boxes 10 and the five power selling-side collection boxes 20, and converted into alternative current in the power conditioner 30 to be supplied to a power selling terminal 99.

Figure 2:
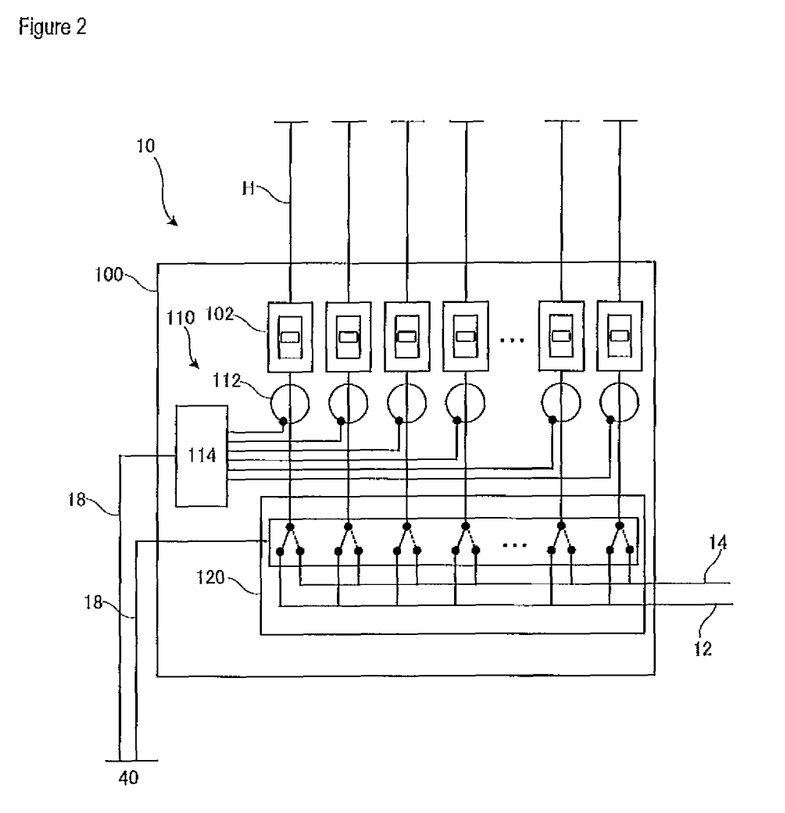
FIG. 2 is a diagram illustrating an internal configuration of a connection box of the same solar power generation management apparatus.

FIG. 2 illustrates a configuration of the connection box 10 being expanded. The connection box 10 includes a casing 100, breakers 102 installed on the individual output lines H of the unit power generation modules M in the casing 100, an output sensor 110 disposed in the casing 100, and a switching device 120 that switches connection destinations of the output lines H between the power selling-side output line 12 and the power storage-side output line 14.

The output sensor 110 has clamp current sensors 112 of Hall element type installed on the individual output lines H, and an amperemeter 114 that senses a current value of each output line H using Hall voltage of the clamp current sensor 112. With the output sensor 110, an output current value of each unit power generation module M can be sensed. Output current value information from the output sensor 110 is transmitted to the calculator 40.

The switching device 120 is connected to the calculator 40 via the communication line 18 and switches the connection destinations of the output lines H based on instruction information from the calculator 40. Specifically, it selects to which of the power selling-side output line 12 and the power storage-side output line 14 the output line H is connected independently for each unit power generation module M. As a result, the outputs of all of the unit power generation modules M connected to the connection box 10 are collected into any of the single power selling-side output line 12 and the single power storage-side output line 14, and their distribution ratio is flexibly changed. Accordingly, particularly when an upper limit is set to the electric power supplied from the power selling-side output line 12, the switching device 120 is controlled to allow only a small margin toward this upper limit and the surplus power is supplied to the battery 70 side.

Figure 7:
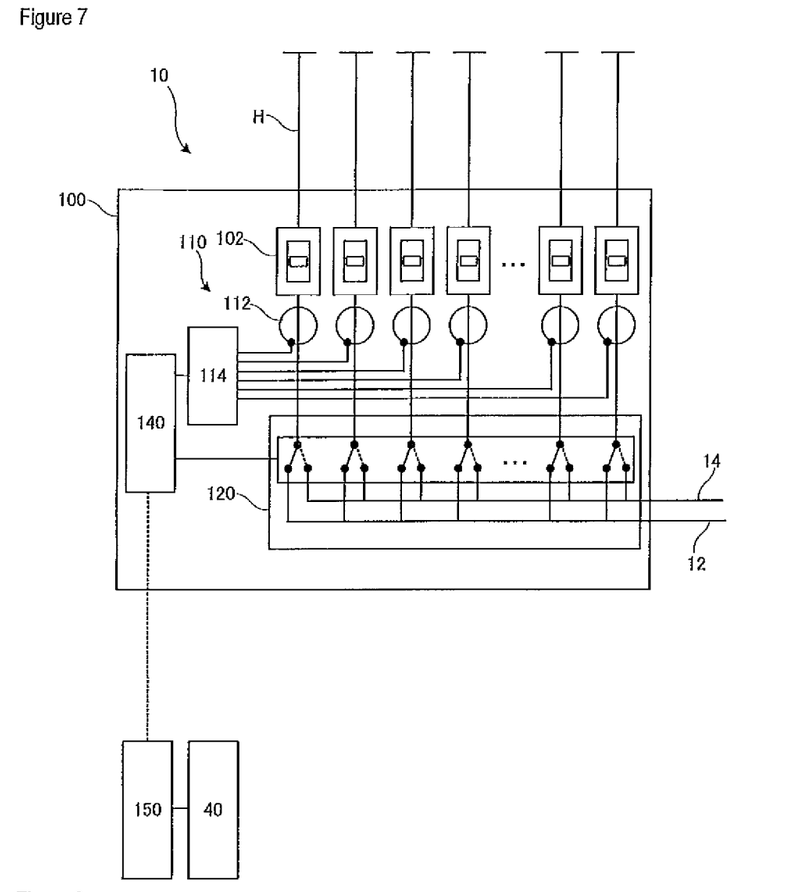
FIG. 7 is a diagram illustrating another example of the internal configuration of the connection box of the same solar power generation management apparatus.

Notably, while here is exemplarily presented the case where the amperemeter 114 and the switching device 120 are connected to the calculator 40 via the wired communication line 18, the present invention is not limited to this but they can be done through wireless communication. For example, as illustrated in FIG. 7, a wireless communication terminal 140 is installed inside or in the periphery of the connection box 10, and to the wireless communication terminal 140, communication lines of the amperemeter 114 and the switching device 120 are connected. Meanwhile, also on the calculator 40 side, a wireless communication terminal 150 is connected. Transmission and reception of signals of the amperemeter 114 and the switching device 120 and a signal of the calculator 114 are preferably performed through the wireless communication terminals 140 and 150 in a wireless manner. When the solar power generation management apparatus 1 is afterward installed with respect to the mega solar power plant, the number of the connection boxes 10 increases and the distance of the communication lines becomes enormous. Nevertheless, such use of the wireless communication lines enables installation load at the site to be largely reduced. Notably, for these wireless communication terminals 140 and 150, it is needless to say that the wireless communication lines provided from a so-called mobile phone company (carrier) can be used.

Moreover, as in the present embodiment, since the output sensor 10 is integrally contained in one connection box 10, the output current can be sensed for each unit power generation module M. Moreover, current value measurement using the vicinity of the breakers is possible, which dramatically improves maintenance ability of the connection box 10.

FIG. 3(A) illustrates a hardware configuration of the calculator 40. The calculator 40 is configured to include a CPU (central processing unit) 45 in which various programs are executed, a memory 46 in which information needed in the CPU 5 is temporarily expanded, an information storage medium 47 in which programs and various data are stored, a communication interface 48 to which a LAN line and the like are connected and which performs communication to the outside (the output sensor 110 and the switching device 120), and the like. It receives sensing information from the output sensor 110, and displays an operating situation of the solar power generation system S on the display 50 and controls the switching device 120. Notably, the information storage medium 47 is configured of a hard disk, a rewritable non-volatile memory, a large-scale storage medium such as a DAT and a DVD, or the like.

Figure 3:
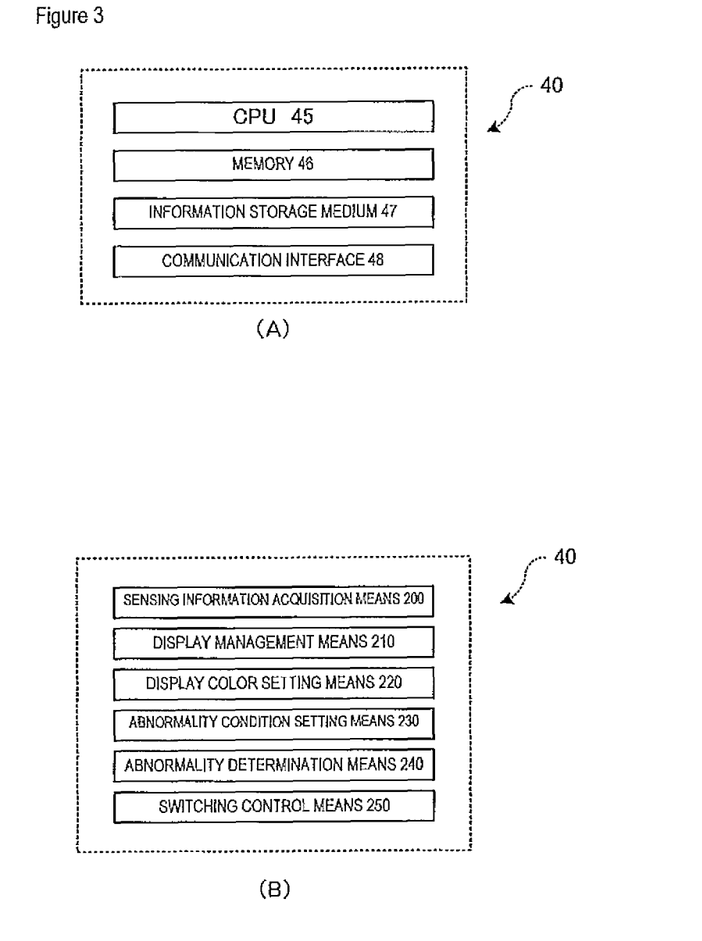
FIG. 3(A) is a block diagram illustrating an internal configuration of a calculator of the same solar power generation management apparatus and FIG. 3(B) is a block diagram illustrating a functional configuration of the same calculator.

FIG. 3 (B) illustrates functional blocks in the calculator 40 which are realized by the control program and the like, which are stored in the information storage medium 47, executed in the CPU 45. Details of these functional blocks are described using user interfaces displayed on the display 50 in FIG. 4 and later.

The calculator 40 includes sensing information acquisition means 200, display management means 210, display color setting means 220, abnormality condition setting means 230, abnormality determination means 240 and switching control means 250.

The sensing information acquisition means 200 acquires the sensing information (information of the output current value) of the output sensor 110 via the communication interface 48 to store it including its history in the information storage medium 47.

Figure 4:
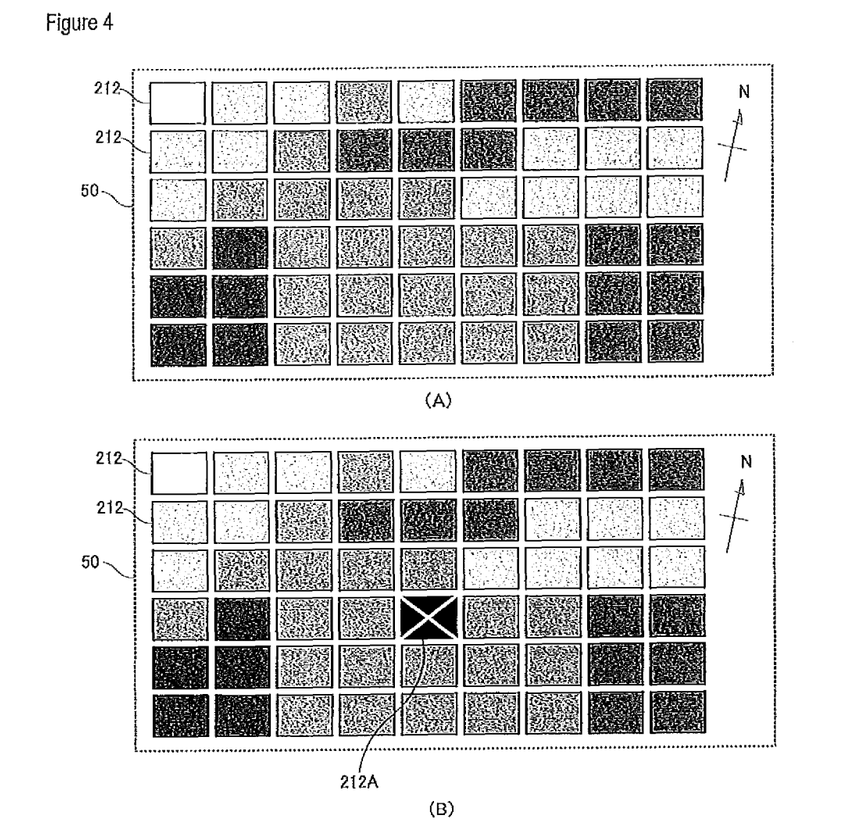
FIG. 4 is a diagram illustrating display states on a display of the same solar power generation management apparatus.

As illustrated in FIG. 4(A), the display management means 210 simultaneously displays a plurality of display frames 212 corresponding to the plurality of unit power generation modules M on the display 50. Specifically, an arrangement of the display frames 212 is displayed so as to be substantially the same as an arrangement configuration of the unit power generation modules M at the site. Thereby, correlation between visual determination on the display 50 and maintenance work at the site can be imaged.

Figure 8:
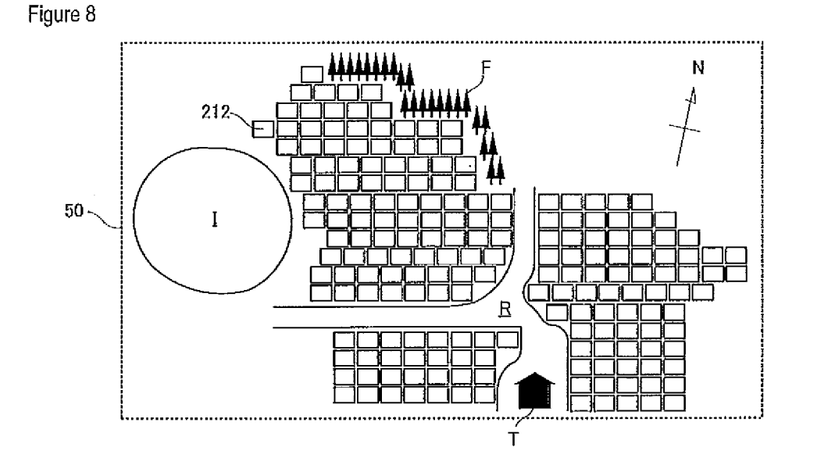
FIG. 8 is a diagram illustrating another example of the display state on the display of the same solar power generation management apparatus.

As a specific example, as illustrated in FIG. 8 by way of example, in addition to the arrangement configuration of the unit power generation modules M at the site, image pictures of roads R, forests F, buildings T, ponds I and the like are preferably simultaneously displayed. In the case of the large-scale solar power generation system S, it takes time to specify the place of the unit power generation module M in which abnormality arises. Nevertheless, as in the present embodiment, by causing the layout of the display frames 212 on the display 50 to coincide with the layout at the site, the place of the unit power generation module M can be visually specified only using the display 50, which enables quick reach to the place of interest. Moreover, by causing the layout of the display frames 212 on the display 50 to coincide with the layout at the site, various kinds of information indicated in the display frames 212 on the display 50 can be analyzed, associated with the geological environment at the site in mind. For example, in the case where power generation efficiency in a specific area is poor, analysis can be quickly made on whether the cause is the shade of the peripheral forest F or some other factor.

The display color setting means 220 sets color levels of the information displayed in the display frames 212 correspondingly to levels (output current values) of the sensing information obtained by the sensing information acquisition means 200. Specifically, in the present embodiment, display is made such that the entirety in a rectangular display frame 212 is colored. Gradual display is made by changing at least any of the brightness, the chroma and the hue of the color correspondingly to the output current value. The color gradation is preferable with which increase and decrease of the output current value can be visually recognized. For example, display of dark color (for example, black) in the occasion when a power generation amount is small and bright color (for example, red) in the occasion when the power generation amount is large is easy to understand. Likewise, white (achromatic color) in the occasion when the power generation amount is small can also be changed to red (chromatic color) in the occasion when the power generation amount is large. Moreover, the hue can also be changed with reference to the color circle. Furthermore, characters (for example, the output current value) can also be displayed in the display frame, in addition to this, changing the color of the characters. Notably, to gradually change a range (area) in which the color is displayed is also included in the definition of the color level of the present invention.

By doing so, operating situations of all of the unit power generation modules M can be individually, specifically and visually monitored. For example, in FIG. 4(A), the display frames 212 of the unit power generation modules M in which the power generation amounts (current values) are small are displayed as gray and the display frames 212 of the unit power generation modules M in which the power generation amounts (current values) are large are displayed as white. According to this display, it is apparent that the output current values of the unit power generation modules M in the bottom left of the display 50 are small. As such an event, there can be beforehand expected various possibilities, as well as a case of being in the shades of surrounding trees or buildings, such as a case where foreign objects such as fallen leaves cover the solar panels P, a case where the solar panels P themselves are malfunctioning, and a case where wiring or connectors are broken.

Moreover, such visual presentation enables the presence or absence of abnormality of the unit power generation modules M to be extremely easily recognized. For example, when the color of the display frame 212 corresponding to one specific unit power generation module M is exceedingly different from the colors of the peripheral neighboring display frames 212, an operator can estimate that this unit power generation module M suffers some electric or mechanical trouble. Moreover, for example, when the colors of a specific area (a plurality of a plurality of display frames 212) constituted of a plurality of neighboring unit power generation modules M are different from the colors of the peripheral display frames 212, not being troubles of the individual unit power generation modules M, it can be determined that an irradiation environment of the sunlight over the whole specific area becomes worse. For example, it can be expected that fallen leaves or a sheet cover those or that those are in the shades of neighboring buildings.

Notably, when the numbers of solar panels P included in the unit power generation modules M are partially different, the output current value of the unit power generation module M can be replaced by an output value (average value) per unit panel obtained by dividing the output current value (power generation amount) of the unit power generation module M by the number of panels. Using the average value per unit panel, the color level of the display translation 212 corresponding to the unit power generation module M is sufficient to be set.

Figure 6:
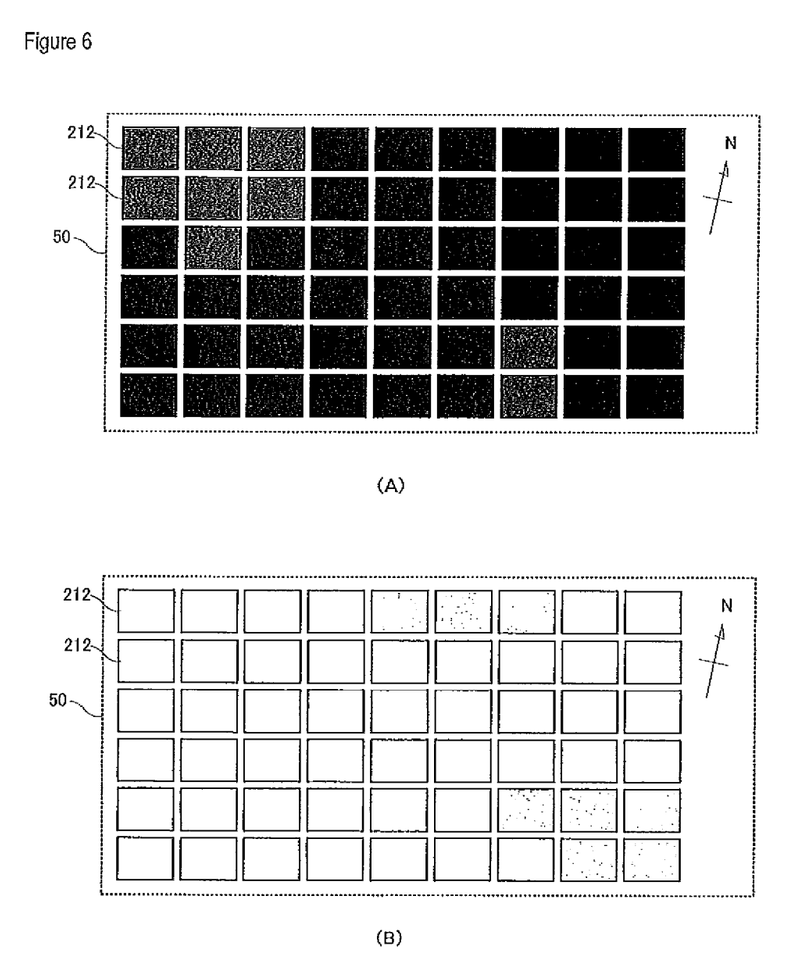
FIG. 6 is a diagram illustrating display states on the display of the same solar power generation management apparatus.

Notably, for reference, FIG. 6(A) illustrates the state of the display 50 in the occasion when power generation hardly occurs at midnight and FIG. 6(B) illustrates the state of the display 50 in the occasion when the power generation amount is at its maximum around 2 PM.

The abnormality condition setting means 230 sets an abnormality condition for sensing the abnormality for each unit power generation module M. Then, the abnormality determination means 240 determines whether or not the sensing information satisfies the abnormality condition, and when the abnormality condition is satisfied, displays abnormality information in the display frame 212. For the abnormality information, there can be thought up various techniques to display the interior of the display frame 212 with a special color, to display a pattern with the color maintained, to display warning characters, and to blink, and similar ones.

For example, FIG. 4(B) illustrates the case where a specific unit power generation module M satisfies the abnormality condition, which leads to display of the abnormality information of a corresponding specific display frame 212A on the display 50. As above, since the place where abnormality arises is visually emphasized and displayed on the display 50, the operator can quickly notice the abnormality and immediately perform maintenance of the unit power generation module M at the site. In this stage, in view of capability of estimating the cause, it is preferable that the color level in the background is left seen as it is.

Specifically, the abnormality condition setting means 230 can set different conditions for the individual unit power generation modules M. As an example of the abnormality condition, an event of the "case where the output current value at noon goes below a predetermined threshold" can be cited. Namely, it is an abnormality condition having the time axis and the current value combined. Here, regarding a specific unit power generation module M, there can also be a case where the output current value always becomes small at noon caused by coming in the shades of the peripheral buildings. For such a specific unit power generation module M, the predetermined threshold is individually set to be small and wasteful abnormality display is prevented. Moreover, when it is determined that maintenance is not performed, for example, while a specific unit power generation module M is noticed to suffer abnormality, this abnormality display can be individually cancelled. Such individual abnormality conditions are set by the operator using an information input device such as a keyboard or a touch sensor on the display 50.

Figure 5:
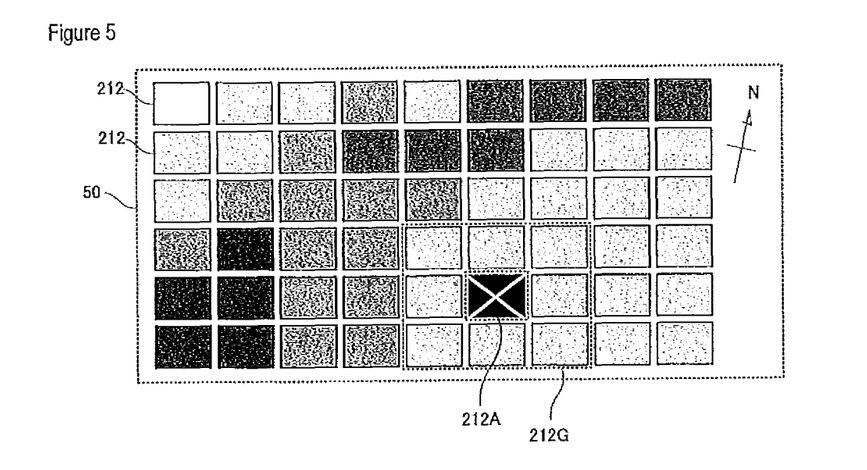
FIG. 5 is a diagram illustrating a display state on the display of the same solar power generation management apparatus.

Furthermore, the abnormality condition setting means 230 refers to, as the abnormality condition of a specific unit power generation module M, the sensing information (output current value information) of a unit power generation module M adjacent to this unit power generation module M. Specifically, for example, as illustrated in FIG. 5(A), an event where the abnormality condition of the display frame 212A corresponding to the specific unit power generation module M is set as the "case where a difference between the current value of the display frame 212A and an average of the output current values of totally eight display frames 212G adjacent thereto exceeds a predetermined threshold" can be cited. According to such an abnormality condition, even if the output current value of the specific unit power generation module M extremely falls due to sudden unfavorable weather, when the difference from the output current values of the peripheral unit power generation modules M is small, abnormality display of the display frame 212A can be prevented.

Furthermore, the abnormality condition setting means 230 is preferably configured to store a history (log) of the output current values for a predetermined period (for example, for the past one year with data acquisition of every five minutes) and to use, as the abnormality condition of a specific unit power generation module M, past sensing information of the same unit power generation module M. As a specific abnormality condition, for example, an event of the "case where a difference between an average of the output current values at the same time for past one week and the current output current value exceeds a predetermined threshold" can be cited. As above, when the abnormality condition is set using data of the immediately past output current values, abnormality display can be prevented in the case where durational change in output current value arises due to seasonal variation (for example, between midsummer and midwinter). Likewise, abnormality display can be prevented also in the case where the solar panels themselves gradually deteriorate.

The switching control means 250 controls the switching device 120 in the connection box 10 using the sensing information (output current value) for each unit power generation module M. Specifically, a unit power generation module M whose output current value largely varies due to some failure can be set to supply the current to the battery 70 via the power storage-side output line 14, which results in control to stabilize the power selling amount. Above all, when power selling upper limit power (electric power above which power selling is not allowed) is set for the power selling-side line 12, referring to this information, the switching device is controlled such that the total output of the plurality of unit power generation modules M comes to the power selling upper limit value as close as possible. For example, when the gross output of the solar power generation system S exceeds the power selling upper limit value, the unit power generation modules M whose outputs are small are switched to supply the current to the battery 70 side in ascending order, and are controlled such that the power selling-side output value becomes smaller than the power selling upper limit value. By doing so, efficient unit power generation modules M can be automatically assigned to the power selling side.

As above, according to the solar power generation management apparatus 1 of the present embodiment, the individual operating states of the unit power generation modules M are displayed as color information on the display 50. Hence, events such as an operation trouble can be extremely quickly and easily noticed. Moreover, the arrangement of the unit power generation modules M displayed on the display 50 is caused to coincide with the arrangement of the unit power generation modules M at the site. Thereby, reach to the unit power generation module M of interest can be achieved without going wrong at the site, which results in reduction of maintenance time.

Furthermore, according to the solar power generation management apparatus 1 of the present embodiment, since abnormality of the unit power generation modules M can be determined highly accurately, wasteless maintenance work can be realized.

Furthermore, according to the solar power generation management apparatus 1 of the present embodiment, since line switching between power selling and power storage can be performed for each unit power generation module using the output sensing results, the output can be optimized as a whole.

Notably, not specially illustrated here, maintenance history recording means is preferably included as a functional block realized by the calculator 40. The maintenance history recording means can record or store a maintenance history through the operator correspondingly to each unit power generation module M. For example, when a specific solar panel P is replaced by new one due to its failure, there can be a case where it is different in output value from that old solar panel P due to difference in performance therebetween. Even in such a case, by referring to the maintenance history on the display 50, it can be immediately understood that the difference in output value is caused by the panel displacement.

Notably, in the present embodiment, while the case where the output current values are sensed is exemplarily presented, output voltage values can be of course sensed.

Moreover, a solar power generation management apparatus of the present invention is not limited to the aforementioned embodiments but various modifications may occur thereon without departing from the spirit of the present invention.

REFERENCE SIGNS LIST

1 Solar power generation management apparatus
10 Connection box
20 Power selling-side collection box
30 Power conditioner
40 Calculator
50 Display
60 Power storage-side collection box
70 Battery

The invention claimed is:

1. A solar power generation management apparatus which manages a solar power generation system using a plurality of solar panels, comprising:
   an output sensor that senses respective output current values or output voltage values of a plurality of unit power generation modules, taking any of a single solar panel and a panel group composed of a predetermined number of solar panels as a unit power generation module;
   a switching device that switches output lines of the unit power generation modules so as to connect them to any of a power selling-side line and a power storage-side line; and
   a calculator that is connected to the output sensor and receives sensing information from the output sensor to display an operating situation of the solar power generation system on a display, wherein
   the calculator
     has sensing information acquisition means that acquires the sensing information of the output sensor,
     has switching control means that controls the switching device using the sensing information,
     has display management means that simultaneously displays a plurality of display frames corresponding to the plurality of unit power generation modules on the display,
     has display color setting means that sets a color level of information displayed in the display frame correspondingly to a level of the sensing information acquired by the sensing information acquisition means, and
     enables operating situations of the plurality of unit power generation modules to be visually monitored based on the color levels in the plurality of display frames on the display, and
   the switching control means refers to a power selling upper limit value of the power selling-side line and selects a part of the unit power generation modules out of the plurality of unit power generation modules to connect them to the power selling-side line such that a total output of the plurality of unit power generation modules is approximated to the power selling upper limit value, and meanwhile, controls the switching device so as to perform switching such that a remaining part of the unit power generation modules is connected to the power storage-side line.

2. The solar power generation management apparatus according to claim 1, wherein
   the calculator includes
   abnormality condition setting means that sets an abnormality condition for sensing abnormality of the unit power generation module, and
   abnormality determination means that determines whether or not the sensing information satisfies the abnormality condition, and when the abnormality condition is satisfied, displays abnormality information in the display frame.

3. The solar power generation management apparatus according to claim 2, wherein
   the abnormality condition setting means of the calculator is capable of setting different conditions for the individual unit power generation modules.

4. The solar power generation management apparatus according to claim 2 or 3, wherein
the abnormality condition setting means of the calculator uses the sensing information of the unit power generation module adjacent to a specific unit power generation module as the abnormality condition of the specific unit power generation module.

5. The solar power generation management apparatus according to claim 2, wherein
the abnormality condition setting means of the calculator uses past sensing information of a specific unit power generation module as the abnormality condition of the specific unit power generation module.

6. The solar power generation management apparatus according to claim 3, wherein
the abnormality condition setting means of the calculator uses the sensing information of the unit power generation module adjacent to a specific unit power generation module as the abnormality condition of the specific unit power generation module.

7. The solar power generation management apparatus according to claim 3, wherein
the abnormality condition setting means of the calculator uses past sensing information of a specific unit power generation module as the abnormality condition of the specific unit power generation module.

8. The solar power generation management apparatus according to claim 4, wherein
the abnormality condition setting means of the calculator uses past sensing information of a specific unit power generation module as the abnormality condition of the specific unit power generation module.

9. The solar power generation management apparatus according to claim 6, wherein
the abnormality condition setting means of the calculator uses past sensing information of a specific unit power generation module as the abnormality condition of the specific unit power generation module.

10. The solar power generation management apparatus according to claim 1, comprising
a connection box that collects output lines of the plurality of unit power generation modules, wherein
the output sensor that senses the output current values or the output voltage values of the output lines is integrally contained in the connection box.

11. The solar power generation management apparatus according to claim 1, wherein
the display management means in the calculator displays the plurality of display frames on the display in a state where they coincide with an arrangement layout of the unit power generation modules at a site.

12. The solar power generation management apparatus according to claim 1, comprising
a wireless communication terminal that connects the output sensor and the calculator through wireless communication.

13. The solar power generation management apparatus according to claim 1, wherein
output of the part of the unit power generation modules is supplied to a common power conditioner via the power selling-side line, and
output of the remaining part of the unit power generation modules is supplied to a common battery via the power storage-side line.

14. The solar power generation management apparatus according to claim 13, wherein
the calculator includes
abnormality condition setting means that sets an abnormality condition for sensing abnormality of the unit power generation module, and
abnormality determination means that determines whether or not the sensing information satisfies the abnormality condition, and when the abnormality condition is satisfied, displays abnormality information in the display frame.

15. The solar power generation management apparatus according to claim 14, wherein
the abnormality condition setting means of the calculator is capable of setting different conditions for the individual unit power generation modules.

16. The solar power generation management apparatus according to claim 14, wherein
the abnormality condition setting means of the calculator uses the sensing information of the unit power generation module adjacent to a specific unit power generation module as the abnormality condition of the specific unit power generation module.

17. The solar power generation management apparatus according to claim 14, wherein
the abnormality condition setting means of the calculator uses past sensing information of a specific unit power generation module as the abnormality condition of the specific unit power generation module.

18. The solar power generation management apparatus according to claim 15, wherein
the abnormality condition setting means of the calculator uses the sensing information of the unit power generation module adjacent to a specific unit power generation module as the abnormality condition of the specific unit power generation module.

19. The solar power generation management apparatus according to claim 15, wherein
the abnormality condition setting means of the calculator uses past sensing information of a specific unit power generation module as the abnormality condition of the specific unit power generation module.

20. The solar power generation management apparatus according to claim 18, wherein
the abnormality condition setting means of the calculator uses past sensing information of a specific unit power generation module as the abnormality condition of the specific unit power generation module.

* * * * *